United States Patent [19]

Palmer

[11] Patent Number: 4,508,608

[45] Date of Patent: Apr. 2, 1985

[54] METHOD FOR MAKING CHALCOGENIDE CATHODES

[75] Inventor: David N. Palmer, Tolland, Conn.

[73] Assignee: Combustion Engineering, Inc., Windsor, Conn.

[21] Appl. No.: 487,157

[22] Filed: Apr. 21, 1983

[51] Int. Cl.³ ............................................. C23C 15/00
[52] U.S. Cl. ................................ 204/192 C; 429/194; 429/218
[58] Field of Search ............................... 429/194, 218; 204/192 C

[56] References Cited

U.S. PATENT DOCUMENTS

| | | | |
|---|---|---|---|
| 4,009,052 | 2/1977 | Whittingham | 429/194 |
| 4,049,879 | 9/1977 | Thompson et al. | 429/194 |
| 4,049,887 | 9/1977 | Whittingham | 429/194 |
| 4,203,861 | 5/1980 | Thorp et al. | 429/218 |
| 4,324,803 | 4/1982 | Bergmann | 204/192 C |

FOREIGN PATENT DOCUMENTS 56-143664  11/1981  Japan .
56-156674  12/1981  Japan .
56-156677  12/1981  Japan .

*Primary Examiner*—Arthur P. Demers
*Attorney, Agent, or Firm*—Brumbaugh, Graves, Donohue & Raymond

[57] ABSTRACT

A method for making a chalcogenide cathode usable in secondary batteries comprises sputtering molecules of an intercalatable layered transition metal chalcogenide cathode active material, such as a titanium sulfide, onto and into a high porosity current collector substrate, such as nickel foam, by impinging a primary beam of argon ions onto a workpiece or target of the material and directing a secondary beam of sputtered molecules of the material at the substrate.

6 Claims, No Drawings

METHOD FOR MAKING CHALCOGENIDE CATHODES

The present invention relates to a method for making chalcogenide cathodes.

The use of di- and tri-chalcogenides or other materials capable of reversibly intercalating lithium atoms into the Van der Waals areas separating the lamellar regions of these materials as cathode active materials in cathodes for lithium non-aqueous secondary energy storage cells or primary energy conversion devices could lead to devices of exceptionally high energy densities compared to conventional ambient and above ambient operating assemblies (~200 W-hr/liter or ~300 W-hr/kg). However, the simple incorporation into a current collector substrate of a compression compact comprising a cathode active material, a cathode depolarizer or conductivity enhancing agent and a binding material results in a cathode that is of sufficiently high density (50%–90% dense) to prevent complete communication of electrolyte-solvent mixtures throughout the bulk of the cathode.

Poor communication of the electrolyte-solvent mixture which carries lithium ions for eventual intercalation into the cathode active material results in under-utilization of the full theoretical energy storage capacity of the cells. This is so because the energy storage capacity as defined by the energy density is a function of the stoichiometry of the lithium intercalate compound formed during the discharge of a secondary battery. Furthermore, this situation creates cells that have high resistance to current flow and display low current densities.

In order to rectify these deficiencies, it would be appropriate to create a cathode with high porosity so as to allow extensive electrolyte-solvent communication throughout the bulk of the cathode. High porosity would also increaese cathode real surface area which in turn would greatly improve cell current density.

In order to accomplish these objectives, the present invention provides a method for making a chalcogenide cathode which comprises sputtering molecules of an intercalatable layered transition metal chalcogenide cathode active material onto and into a high porosity current collector substrate by impinging a primary beam of argon ions onto a workpiece or target of said material and directing a secondary beam of sputtered molecules of said material at said substrate.

Thus, the present invention is based on the unexpected finding that the layered chalcogenides, due to their unusual structure (particularly the di- and tri-sulfides), sputter as molecules or biradicals, rather than dissociate into ions, when bombarded with ions of inert atoms, such as argon ions.

Suitable compounds and features utilized in the method of the present invention are exemplified below.

CATHODE ACTIVE MATERIALS

Intercalatable layered transition metal chalcogenide cathode active materials and cathodes for lithium nonaqueous secondary batteries containing such materials are well known and are disclosed, for example, in U.S. Pat. Nos. 4,009,052; 4,049,879; 4,049,887; 4,198,476; 4,206,276; 4,207,245; 4,228,226; and 4,233,377. Such materials include the di-, tri- and mixed chalcogenides (e.g., oxides, sulfides, selenides, tellurides) of the transition metals of Groups 1b to 7b and 8 of the Periodic Table of Elements (e.g., titanium, vanadium, tantalum, chromium, cobalt, nickel, manganese, niobium, ruthenium, molybdenum, hafnium, zirconium and tungsten). These materials can further contain phosphorus or a halide (bromine, chlorine, iodine). A preferred cathode active material is a titanium sulfide, e.g., titanium disulfide or titanium trisulfide.

HIGH POROSITY CURRENT COLLECTOR SUBSTRATES

Useful high porosity current collector substrates include the following:

foamed nickel or similar foamed metals foamed glass that has been plated with an inert or noble metal to increase surface conductivity foamed polymers containing a surface or bulk conductivity agent foamed Ti-, Nb-, Zr-, W-, Ta-carbides foamed molybdenum disilicide reduced metal reacted molecular or carbosieves carbon, graphite or viterous carbon fiber or fibril laminates of ultrahigh surface area.

All high porosity current collector substrates should be 97% to 90% porous or 3% to 10% dense with 10 to 1000 pores per square inch or sufficient surface area to exceed 1000 $m^2/cm$. A preferred high porosity current collector substrate is nickel foam having 35–100 pores per square inch.

The primary beam of argon ions can be impinged onto the workpiece or target at about 25–30 kiloelectron volts (KeV) under a vacuum of $10^{-6}$ to $10^{-7}$ torr. The substrate to be coated or plated with the sputtered molecules can be placed at an angle of 90° opposite the argon impingement primary beam onto the workpiece.

The method of the present invention will be illustrated by the following representative examples thereof.

EXAMPLE 1

A workpiece or target of titanium disulfide was impinged by a primary beam of argon ions at about 25–30 kiloelectron volts under a vacuum of $10^{-6}$ to $10^{-7}$ torr. A nickel foam substrate having 35–100 pores per square inch was placed at a 90° angle opposite the argon impingement primary beam onto the workpiece so that the secondary beam of sputtered molecules of titanium disulfide were directed at the nickel foam substrate. The nickel foam substrate was translated and rotated during the sputtering operation.

Energy dispersive X-ray analysis of the so-coated or plated nickel foam verified that the titanium disulfide was sputtered over as titanium disulfide with only a small fraction of sulfur and also showed that the titanium disulfide coating was very adherent and completely covered the nickel foam surface. SEM (scanning electron microscopy) photomicrographs of the so-coated nickel foam vividly showed that the titanium disulfide was present as a layered compound as indicated by the nodular geometry of the coating and that the nickel foam was completely covered with an approximately 3–5 mil coating.

The so-prepared cathode was used in a lithium nonaqueous secondary cell configuration. The cell properties were as follows: internal resistance—20 ohms; discharge current—32 mA; and discharge current density—1.58 $mA/cm^2$.

EXAMPLE 2

A workpiece or target of titanium disulfide was impinged by a primary beam of argon ions at about 25-30 kiloelectron volts under a vacuum of $10^{-6}$ to $10^{-7}$ torr. A circular titanium screen substrate (Exmet) having a diameter of 25.4 mm and a thickness of 1-5 mm with apertures of 1.5-2 mm was placed at a 90° angle opposite the argon impingement primary beam onto the workpiece so that the secondary beam of sputtered molecules of titanium disulfide were directed at the titanium screen substrate.

Energy dispersive X-ray analysis of the so-coated or plated screen verifies that the titanium disulfide was sputtered over as titanium disulfide with only a small fraction of sulfur and also shows that the coating is very adherent and completely covers the nickel foam surface. SEM photomicrographs of the so-coated titanium screen vividly show that the titanium disulfide is present as a layered compound as indicated by the nodular geometry of the coating and that the wires of the titanium screen are completely covered with an approximately 0.5-1 mil coating.

The so-prepared cathode was used in a lithium nonaqueous secondary cell configuration. The cell properties were as follows: internal resistance—36 ohms; discharge current—25 mA; and discharge current density—2.2 mA/cm$^2$.

The above procedure of Example 2 was also followed except for using an expanded nickel screen and a knitted copper compact or disc as the substrates with comparable results.

What is claimed is:

1. A method for making a high porosity chalcogenide cathode which comprises sputtering molecules of an intercalatable layered transition metal chalcogenide cathode active material onto and into a high porosity current collector substrate having a porosity of from about 10 to about 1000 pores per square inch to produce a coating of from about 0.5 to about 3 mils thickness by impinging a primary beam of argon ions onto a workpiece of said material at approximately 25-30 kiloelectron volts under a vacuum of $10^{-6}$ to $10^{-7}$ torr and directing a secondary beam of sputtered molecules of said material at said substrate.

2. A method according to claim 1 wherein said intercalatable layered transition metal chalcogenide cathode active material is a titanium sulfide.

3. A method according to claim 2 wherein said titanium sulfide is titanium disulfide.

4. A method according to claim 2 wherein said titanium sulfide is titanium trisulfide.

5. A method according to claim 1 wherein said high porosity current collector substrate is nickel foam.

6. A method according to claim 1 wherein said substrate is placed at a 90° angle opposite the argon impingement primary beam onto said workpiece.

* * * * *